United States Patent [19]
Yilmaz et al.

[11] Patent Number: 5,597,765
[45] Date of Patent: Jan. 28, 1997

[54] METHOD FOR MAKING TERMINATION STRUCTURE FOR POWER MOSFET

[75] Inventors: Hamza Yilmaz, Saratoga; Fwu-Iuan Hshieh, San Jose, both of Calif.

[73] Assignee: Siliconix incorporated, Santa Clara, Calif.

[21] Appl. No.: 423,588

[22] Filed: Apr. 17, 1995

Related U.S. Application Data

[62] Division of Ser. No. 371,174, Jan. 10, 1995.

[51] Int. Cl.$^6$ ................................................. H01L 21/44
[52] U.S. Cl. .............................. 437/203; 437/40; 437/41; 437/52
[58] Field of Search .................................... 437/41, 42, 40, 437/203, 49, 52

[56] References Cited

U.S. PATENT DOCUMENTS

| | | | |
|---|---|---|---|
| 4,710,265 | 12/1987 | Hotta | 437/29 |
| 4,819,052 | 4/1989 | Hutter | 357/49 |
| 4,941,026 | 7/1990 | Temple | 357/339 |
| 4,954,854 | 9/1990 | Dhong et al. | 257/332 |
| 5,019,526 | 5/1991 | Yamane et al. | 437/37 |
| 5,072,266 | 12/1991 | Bulucea et al. | 257/339 |
| 5,087,577 | 2/1992 | Strack | 437/203 |
| 5,156,993 | 10/1992 | Su | 437/203 |
| 5,160,491 | 11/1992 | Mori | 437/203 |
| 5,168,331 | 12/1992 | Yilmaz | 257/339 |
| 5,316,959 | 5/1994 | Kwan et al. | 437/203 |
| 5,341,011 | 8/1994 | Hshieh et al. | 257/330 |
| 5,362,665 | 11/1994 | Lu | 437/203 |
| 5,404,040 | 4/1995 | Hshieh et al. | 437/49 |
| 5,422,508 | 6/1995 | Yilmaz et al. | 257/370 |
| 5,429,964 | 7/1995 | Yilmaz et al. | 437/154 |

FOREIGN PATENT DOCUMENTS

| | | | |
|---|---|---|---|
| 0345380 | 12/1989 | European Pat. Off. | 257/330 |
| 2647596 | 5/1990 | France . | |
| 3932621 | 9/1989 | Germany . | |
| 56-58267 | 5/1981 | Japan | 257/335 |
| 59-84474 | 5/1984 | Japan | 257/329 |
| 62-176168 | 8/1987 | Japan | 257/342 |
| 1-42177 | 2/1989 | Japan | 257/339 |
| 1-198076 | 8/1989 | Japan . | |
| 1-310576 | 12/1989 | Japan . | |
| 2-91976 | 3/1990 | Japan . | |

OTHER PUBLICATIONS

Barbuscia, et al., *IEDM*, 1984, pp. 757–760 "Modeling of Polysilicon Dopant Diffusion for Shallow–Junction Bipolar Technology".
S. C. Sun et al., pp. 356–367, *IEEE Trans, Electron Devices*, vol. ED–27, Feb. 1980 "Modeling of The On–Resistance of LDMOS, VDMOS, and VMOS Power Transistors".
Chang et al., et al. "Vertical Fet Random–Access Memories with Deep Trench Isolation", *IBM Technical Disc. Bulletin*, Vo. 22, No. 8B, Jan. 1980, pp. 3683–3687.
P. Ou-Yang, "Double Ion Implanted V-Mos Technology", *IEEE Journal of Solid State Circuits*, vol. SC–12, No. 1, Feb. 1977, pp. 3–8.
K. Shenai, et al., International Electron Devices Meeting, 9 Dec. 1990, San Francisco, USA, pp. 793–797,.

*Primary Examiner*—Tom Thomas
*Assistant Examiner*—Kevin M. Picardat
*Attorney, Agent, or Firm*—Skjerven, Morrill, MacPherson, Franklin & Friel; Norman R. Klivans

[57] ABSTRACT

A termination structure (located along a transistor perimeter or a die edge) for a trenched MOSFET or other semiconductor device prevents the undesirable surface channelling phenomena without the need for any additional masking steps to form a channel stop. This structure is especially applicable to P-channel MOSFETs. In the prior art a mask defines a doped channel stop. Instead here, a blanket ion implantation of P-type ions is performed after the active area masking process. Thus this doped channel stop termination is in effect masked during fabrication by the field oxide. In another version the channel stop termination is an additional trench formed in the termination region of the MOSFET. The trench is conventionally lined with oxide and filled with a conductive polysilicon field plate which extends to the edge of the die. In another version, the doped and trenched channel stops are used in combination. The channel stops are enhanced by provision of field plates overlying them on the die surface.

11 Claims, 7 Drawing Sheets

FIG. 6f

METHOD FOR MAKING TERMINATION STRUCTURE FOR POWER MOSFET

This application is a division of application Ser. No. 08/371,174, filed Jan. 10, 1995.

FIELD OF THE INVENTION

This invention pertains to transistors and more specifically to a termination structure for power MOSFETs.

DESCRIPTION OF THE PRIOR ART

The trenched MOSFET (metal oxide semiconductor field effect transistor) is a well known type of transistor having a gate electrode formed in a trench in a semiconductor substrate. MOSFETs are either P-channel or N-channel type. Especially in the P-channel type, there is a problematic phenomenon called "channelling". Channelling is often caused by the relatively high temperature burn-in used in testing such devices which causes the device to become "leaky". That is, a small channel is created that causes current to flow even though the voltage between the gate and the source regions ($V_{GS}$) is zero. Thus undesirably when the MOSFET is intended to be off, i.e. $V_{GS}$ is zero, instead a small current is propagated which alters the characteristic of the transistor, causing the transistor to be useless by being turned on and wasting power instead of being turned off.

Channelling is a function of the amount of fixed charge in the oxide and immediately adjacent upper portion of the substrate. Any such fixed charge may be depleted during oxidation. Charge depletion enables inversion (channelling).

It is believed that this channeling may be exacerbated by the high burn-in temperatures moving the charges present in the oxide layer overlying the edges of the transistor. This is partly the result of the segregation of boron from the substrate principal surface during oxidation, which in effect causes the principal surface to have less P-type charge. The lightly doped P-type surface is inverted to be an N-type surface by the positive charge in the dielectric (mostly silicon dioxide) overlying the P-type surface. Thus an N-type "skin layer" forms extending to the scribe line at each die edge. This high resistance (but conductive) skin layer path to the scribe edge causes the channelling effect, which occurs on both monocrystal and epitaxial layer substrates. This has been found to be primarily a problem when the dopant is boron.

Such channelling is generally not a problem for P-channel transistors that are operating at low voltage, but it is a problem for P-channel transistors operating at higher voltage, i.e. greater than 30 volts and especially greater than 60 volts. The boron depletion effect in the upper portion of the substrate is greater for high voltage transistors which typically have a high epitaxial layer resistivity. Because a lower resistivity epitaxial layer is used for low voltage P-channel DMOS devices than for high voltage devices, a low voltage device has less susceptibility to channelling than a high voltage device. Thus channelling is primarily a problem for power (high voltage) transistors.

Figure 1:
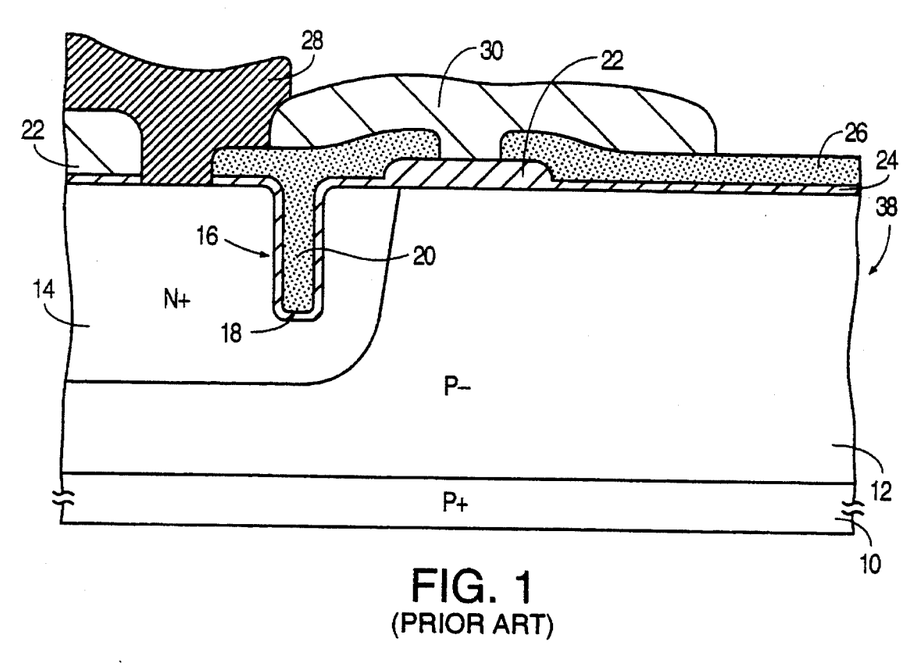
FIG. 1 shows a termination portion of a prior art MOSFET in cross section.

FIG. 1 shows a termination (perimeter) portion of a prior art MOSFET including the P+ doped lower portion 10 of the substrate and the upper P− doped portion 12 which is for instance an epitaxial layer. It is to be understood that FIG. 1 only shows the termination portion of the transistor. The active portion of the transistor including other trenches holding a conductive gate electrode, the source and body regions, and the associated metallization contacts are not shown but are conventional. Formed in epitaxial layer 12 is the N+ doped region 14 in which is formed, in trench 16, an insulating gate oxide layer 18 and a doped polysilicon (polycrystalline silicon) conductive gate finger 20. Portions of conductive gate finger 20 extend over the principal surface of the epitaxial layer 12.

Portions of a thin gate oxide layer 24 insulate the principal surface of epitaxial layer 12. Other portions of principal surface of epitaxial layer 12 are insulated by a thick field oxide layer 22. Metal contact 28 contacts the body region 14. The passivation (BPSG) layer 30 is formed overlying portions of the transistor. A doped polysilicon field plate 26 overlies the termination region (edge) of the integrated circuit die (substrate) extending to the saw or scribe street 38 which defines in this case the right hand portion of the die.

In this case the only channel stop effect is that provided by the field plate 26, which has been found inadequate to prevent channelling, especially for a thick gate oxide and high voltage device with higher epitaxial layer resistivity.

This problem has been recognized and a solution provided for planar (non-trenched) MOSFETs. The solution is to provide a termination structure including a positively doped region (not shown) at the edge of each integrated circuit die (surrounding each transistor). Thus this edge termination uses an additional mask step to form an N+ doped channel stop region for an N-channel transistor (or a P doped channel stop region for a P-channel transistor). This channel stop structure, which is a doped region formed along the edges of the integrated circuit die, is known to prevent the channeling phenomena by overcoming the P dopant depletion by providing additional P dopant.

While this doped region channel stop is effective for planar transistors, it has the significant disadvantage of requiring an additional mask step and an additional implantation step first to define and then to actually form the channel stop region. This undesirably adds cost.

Thus there is a need for a channel stop for trenched MOSFETs requiring minimal or no additional process steps over those of the main process flow.

SUMMARY

In accordance with the invention, a channel stop region is provided for a trenched MOSFET. Formation of the channel stop region does not require any additional masking steps. A first type of channel stop in accordance with the invention uses a blanket boron ion implantation after the active area masking process, to form a P doped region along the perimeter of the active portion of a semiconductor device. This doped region is a useful channel stop. Overlying the channel stop a field plate is formed of, for instance, doped polysilicon to enhance the effective termination region. The channel stop region is implanted using the field oxide as a mask and hence no additional mask is required.

Also in accordance with the invention an alternate channel stop is provided in the transistor termination region by forming a trench in the termination region and conventionally insulating the trench and then filling it with a conductive structure. This additional trench, formed using the same steps as the trenched gate electrodes of the active portion of the transistor, provides an effective channel stop at the perimeter of the semiconductor device. Since the trench gate oxidation lining is thinner than the field oxide formed on the principal surface of the substrate, doping concentration at the silicon surface on the sidewalls of the trench is higher than at the principal surface of the substrate.

In another embodiment, the trenched channel stop and the maskless implanted channel stop are used in combination for maximum channeling prevention.

Also for the trenched channel stop, in one embodiment the trenches extend to the edge of the die. Scribing of the die from the wafer electrically shorts the channel stop to the transistor drain region, thus further enhancing the channel stop effect. Also, more than one trenched channel stop may be provided.

DETAILED DESCRIPTION OF THE PREFERRED EMBODIMENTS

Figure 2:
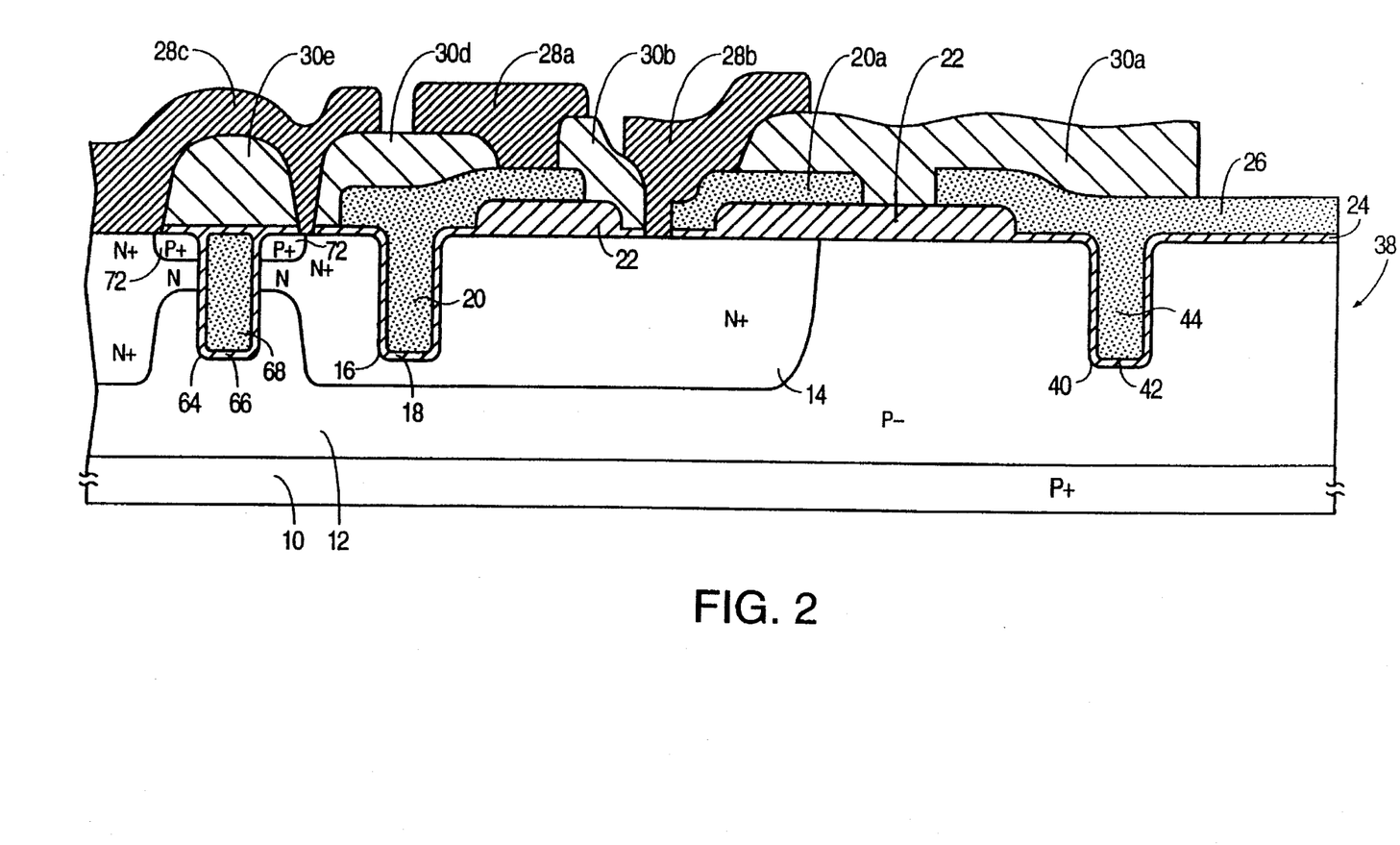
FIG. 2 shows a MOSFET with a trenched channel stop in cross section.

FIG. 2 is a cross section of a MOSFET having elements identical to those of the prior art MOSFET of FIG. 1, these elements having identical reference numbers to those of FIG. 1. FIG. 2 also shows (to the left in the drawing) the active portion of the transistor which includes trench 64 lined by gate oxide 66 and filled by conductive gate electrode 68 which is conventionally doped polycrystalline silicon. Adjacent the upper portions of trench 64 and in the upper part of epitaxial layer 12 are the P+ doped source regions 72 which are contacted by the source metallization 28c which also contacts the N+ doped body region 14. Body region 14 thus also includes N doped regions immediately below regions 72. As can be seen in this embodiment, the gate finger metallization 28 contacts the doped polysilicon 20 which contacts the gate fingers, encircling the active portion of the transistor. Also shown here are other portions of the polysilicon layer 20a and other portions of the BPSG layer 30a, 30b, 30d and 30e, as well as source/body contact 28c and body region contact 28b. Also shown in the far right of the drawing is the scribe line 38.

Also present in the FIG. 2 MOSFET in accordance with the present invention and of most importance is a trench 40 formed in the transistor termination region (at the right of the drawing). Formed in trench 40 are thin gate oxide insulating layer 42 and a conductive filler structure 44 which is doped polysilicon, a portion of which extends overlying the principal surface of the substrate 12 thus forming the conductive field plate 26. This structure is a channel stop at the edge (perimeter) of the die (integrated circuit "chip" or discrete component).

As is readily understood, the trench 40 and the accompanying structures 42 and 44 are formed respectively in the same steps as are active area trench 16, insulating layer 18, and gate electrode 20. Thus no additional masking or process steps are required for the termination region trenched structure, and so this termination is fully compatible with a conventional process flow. The channel stop structure 40, 42, and 44 interrupts the channeling effect and hence reduces or eliminates same. This operates partly because the thin insulating oxide layer 42, which is part of oxide gate layer 24 and which lines the sidewalls of trench 40, is much thinner than the field oxide layer 22. Advantageously fewer boron ions are depleted from the upper portion of epitaxial layer 12 into the oxide layer 40 than into field oxide layer 22, hence providing sufficient doping concentration with boron ions in epitaxial layer 12 adjacent trench 40 and thereby preventing channeling.

A trench channel stop as shown in FIG. 2 also forces any channelling carriers to go down deep into the substrate along the sidewalls of trench 40, rather than merely flowing along the surface of epitaxial layer 12 as they would in the prior art structure of FIG. 1. This prolonging the carrier path via the trench advantageously also reduces channelling. In addition, the effective surface of the substrate, so far as the channeling carriers are concerned, is along the sidewalls of trench 40. This is a relatively "fresh" surface not subject to as much processing as is the principal surface of epitaxial layer 12 due to its not having been subject to field oxidation. Hence the concentration of P-type ions is relatively high along the sidewalls of trench 40, thus further reducing the channelling effect.

The trench 40 is inset from edge 38 by a distance as required by the particular process design rules, typically about 10 microns. The polysilicon field plate 26 is advantageously electrically shorted via the "saw street" edge 38 to the drain region (substrate 10).

In another embodiment (not shown) there are multiple channel stop trenches in the termination region, each filled with a conductive polysilicon structure, for enhanced channel stop effect.

Another channel stop structure in accordance with the present invention is illustrated in FIG. 3, again including many elements identical to those of FIGS. 1 and 2 and having similar reference numbers. However, there is no trenched channel stop in FIG. 3; instead the channel stop is a maskless doped channel stop region 50 which is a P-doped region formed in the termination region and overlain by polysilicon field plate 26. Advantageously, channel stop region 50 is formed without any masking step, by a blanket dopant (boron) implantation following the formation of field oxide region 22, which may be e.g. a LOCOS region or a mask patterned region. This P-doped region 50, which is typically a boron implantation, increases the surface concentration of P-type ions to compensate for ion loss caused by the formation of the overlying oxide layers. Typically the dosage level of boron is 5E11 to 2E12/cm$^2$. This is a low energy dose since the intention is to provide the channel stop region 50 only near the principal surface of epitaxial layer 12.

Figure 3:
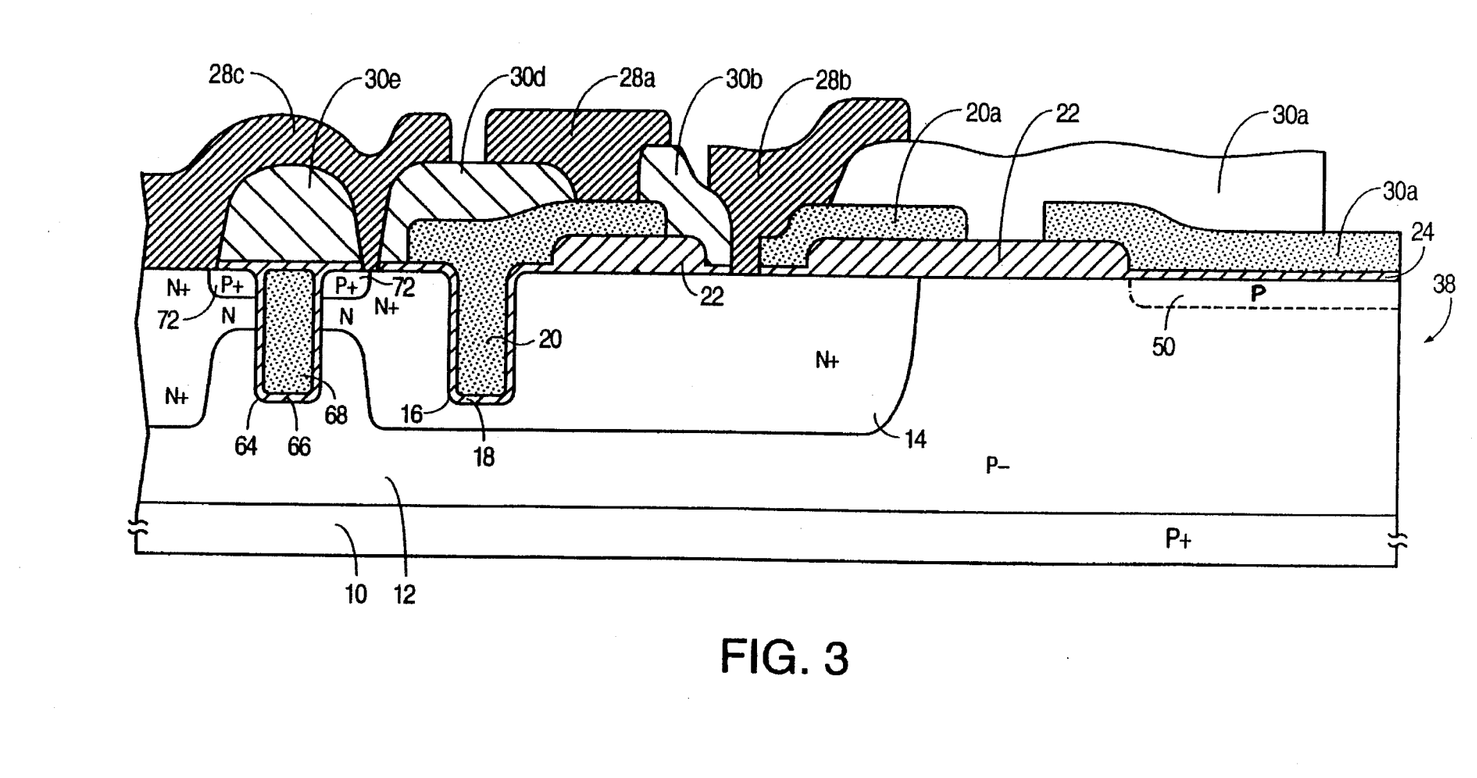
FIG. 3 shows a MOSFET with a doped channel stop in cross section.

Although this is a blanket implantation and hence occurs over the entire principal surface of epitaxial layer 12, it has no significant effect in the active body region 14 since the P-doping is overcome by the much higher N-type dopant concentration in the body region 14. A possible upper limit on the dosage level of the P-type implant for region 50 is ½ of that of the dosage level of the body region 14 N-type dopant (but this is not limiting). (Exemplary implant energy levels are 5E11 for region 50 and 2E13 for region 14.) The typical width of the channel stop implant 50 is greater than 1.0 microns (μm) and a typical depth is greater than 0.1 microns. A typical width of field plate 26 is 10 to 20 microns.

The method and structure in accordance with the present invention are not limited to MOSFETs but also apply to other semiconductor devices such as bipolar transistors, IGBTs, and other types of devices typically operating in the high voltage range, typically over 30 volts, where channeling is a problem.

Figure 4:
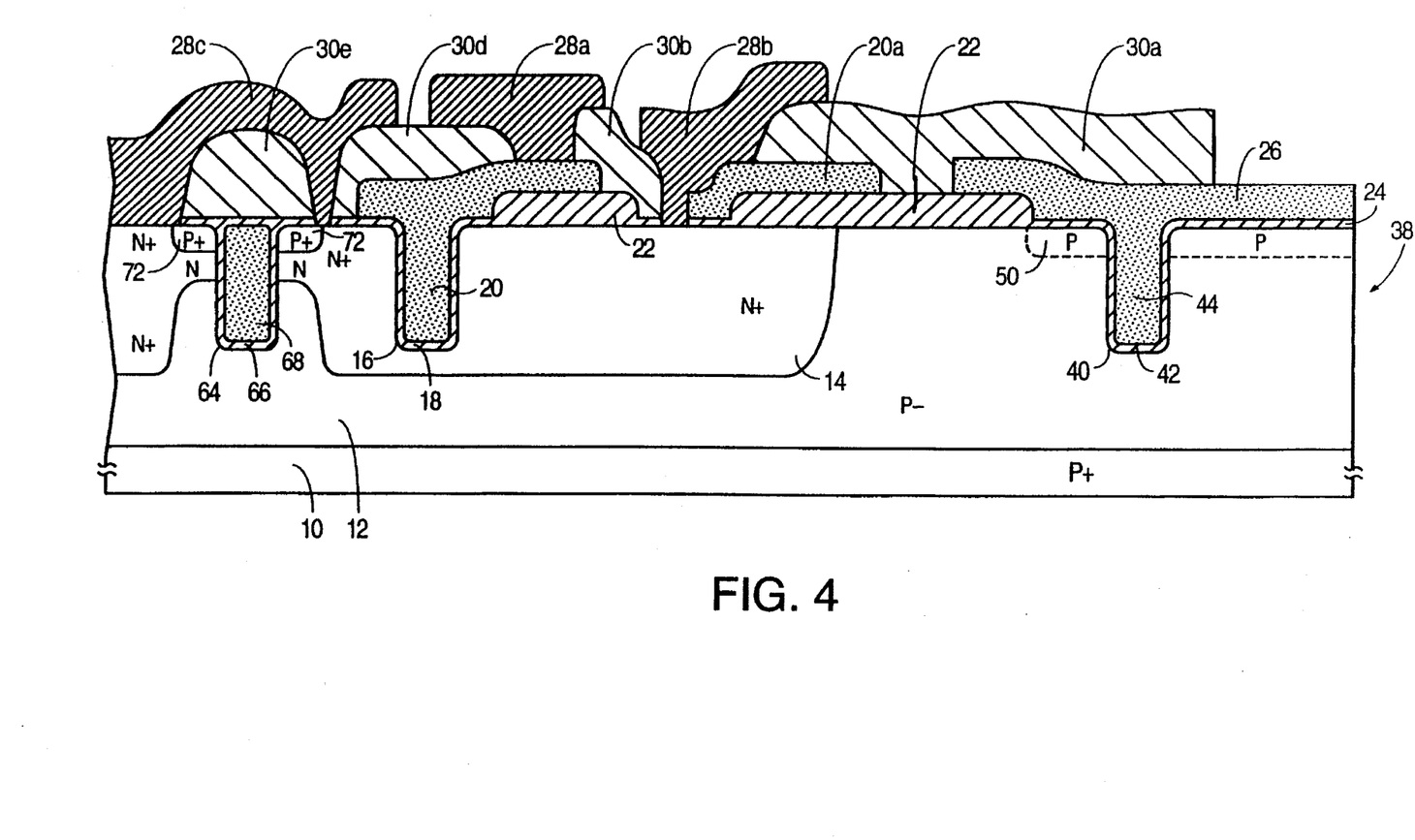
FIG. 4 shows a MOSFET with both a trenched channel stop and a doped channel stop in cross section.

FIG. 4 shows a combination of the P doped channel stop region 50 with the trenched channel stop 40 in one device. This combination has been found to virtually eliminate any channelling by the combined effect. In this case typically region 50 is implanted prior to formation of the trenches 16 and 40 so that the trench 40 penetrates down through the already formed P doped channel stop region 50. Also as in FIG. 3, this blanket boron implant of region 50 is prior to the N-type implant to form body region 14.

Figure 5:
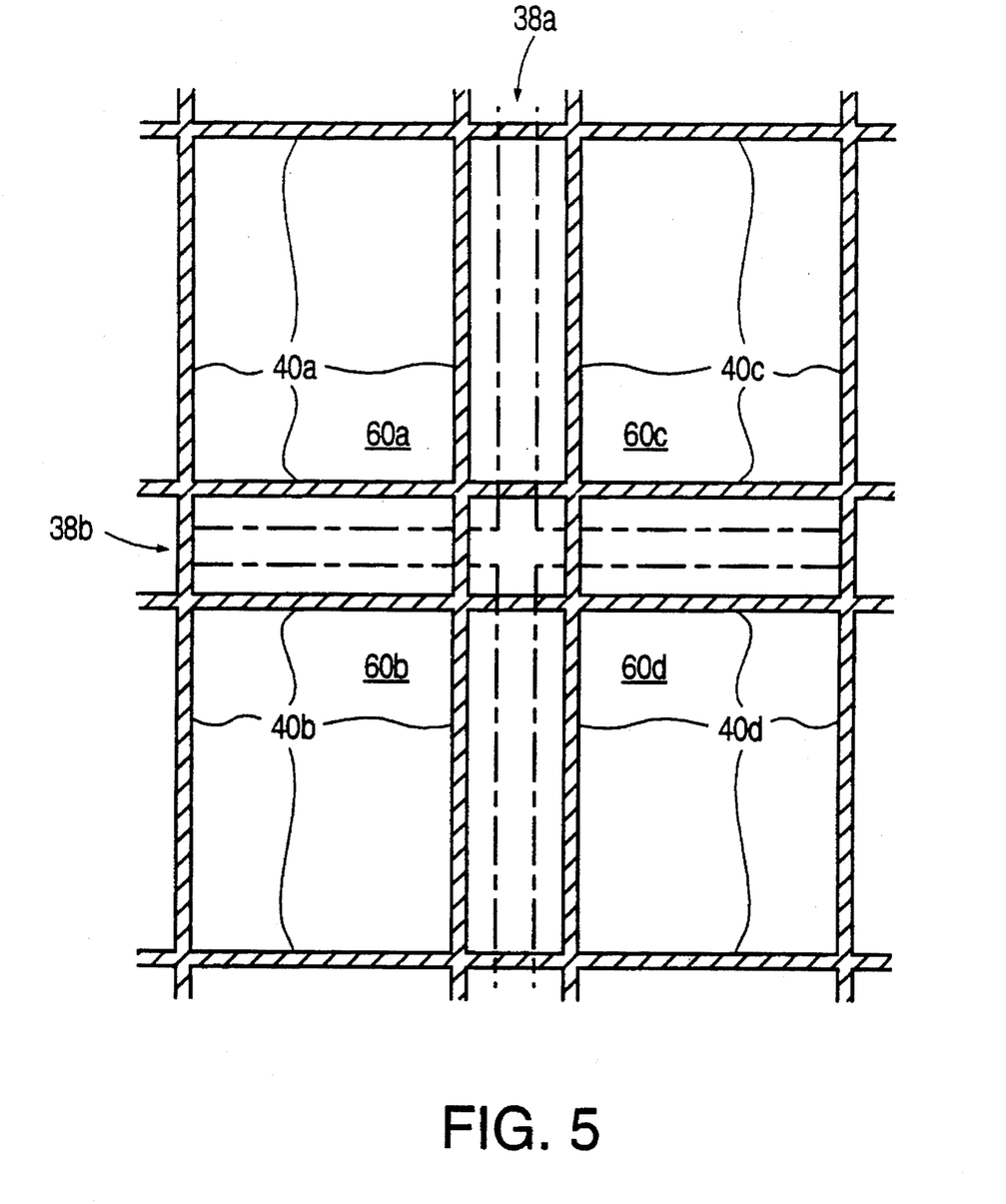
FIG. 5 shows a top view of several semiconductor die on a wafer with a trench pattern.

FIG. 5 shows a top view of a portion of a semiconductor wafer in accordance with the present invention. Shown are four die 60a, 60b, 60c, and 60d (prior to scribing from the wafer) and each including at least one MOSFET transistor (not shown). (It will be understood that typically each MOSFET transistor is actually a large number of transistor cells connected together. Each die may be a discrete MOSFET or a MOSFET on an integrated circuit.)

For die 60a, shown are four trench segments each designated 40a and located along the perimeter of the die 60a. These trench segments 40a correspond to trench 40 of FIG. 2 or FIG. 4. (No other structures are shown since the intention here is merely to illustrate the channel stop trench location relative to the scribe lines.) The scribe lines are defined by the scribe (saw) streets 38a and 38b, only two of which are shown here. As can be seen the trench segments 40a, 40b, 40c and 40d respectively for each of the four die 60a, 60b, 60c, 60d are located just inside the edges of the saw streets 38a, 38b so that the trenches actually cross the saw streets at the die corners, as shown. This crossing of the saw streets by the trenches ensures that the channel stop trench conductive structures (e.g. 44 shown in FIG. 2) are electrically shorted at the scribe lines to the drain region 10. It will be understood that while the trench segments 40a, 40b, 40c and 40d of FIG. 5 are laid out to define a rectangular pattern, this is not necessary; other configurations of trenches also are usable in accordance with the present invention. That is, the transistors may be hexagonal, octagonal, circular, linear, or other shapes.

Fabrication of structures in accordance with the present invention will be readily understood by one of ordinary skill in the art and includes conventional process steps. The formation of the trenched channel stop as shown in FIG. 2 is not explained herein in detail. As described above, formation of the trench 40, trench insulating lining 42 and trench conductive filling structure 44 and structures 16, 18, and 20 is included in the same set of steps as forming the corresponding elements in the active portions of the transistor, and merely requires adaptation of the associated masks so as also to define structures 40, 42, and 44. Hence no further detail is provided as to fabrication of the trenched channel stop.

The following describes one method of fabrication of the implanted P doped channel stop region 50 of FIGS. 3 and 4; it is to be understood that such a structure may be formed by other methods and still be in accordance with the present invention. Also, this does not describe the associated steps in forming the corresponding active portions of the transistor, which steps are conventional and performed contemporaneously with those disclosed hereinafter.

Figure 6A:
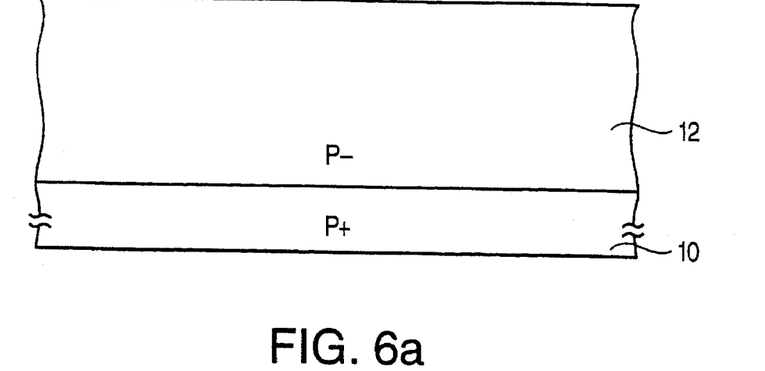
FIGS. 6a to 6f show fabrication of the termination region of the structure of FIG. 3.

Starting in FIG. 6a, a conventional P+ doped substrate 10 is provided on which is formed a P− doped epitaxial layer 12. (FIG. 6a and following, as is true of the other figures in this disclosure, are not drawn to scale).

Figure 6B:
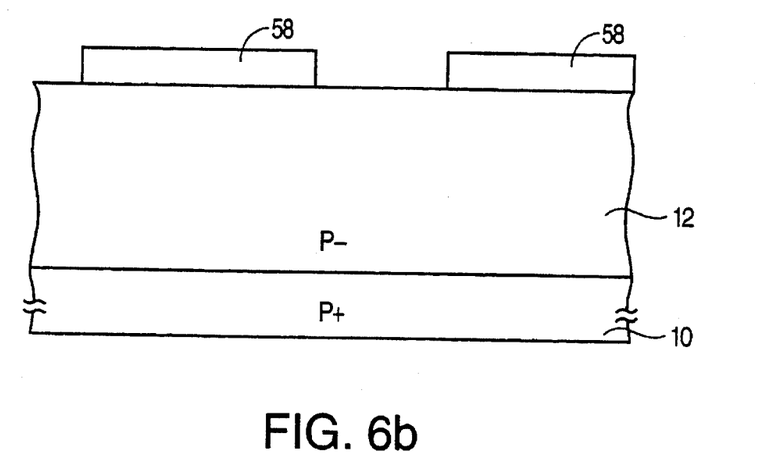
Figure 6C:
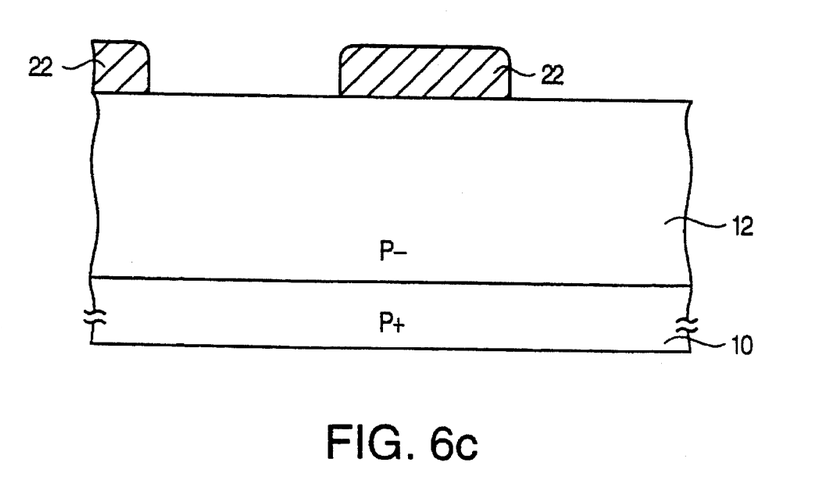

In FIG. 6b a conventional field oxide LOCOS mask layer 58 is formed and patterned on the principal surface of epitaxial layer 12. Then in FIG. 6c the field oxide layer 22 is grown by local oxidation of silicon where mask layer 58 is not present; mask 58 is then stripped off. It is to be understood that alternatively the field oxide layer 22 could be grown over the entire surface of epitaxial layer 12 and then masked with portions thereof removed by etching.

Figure 6D:
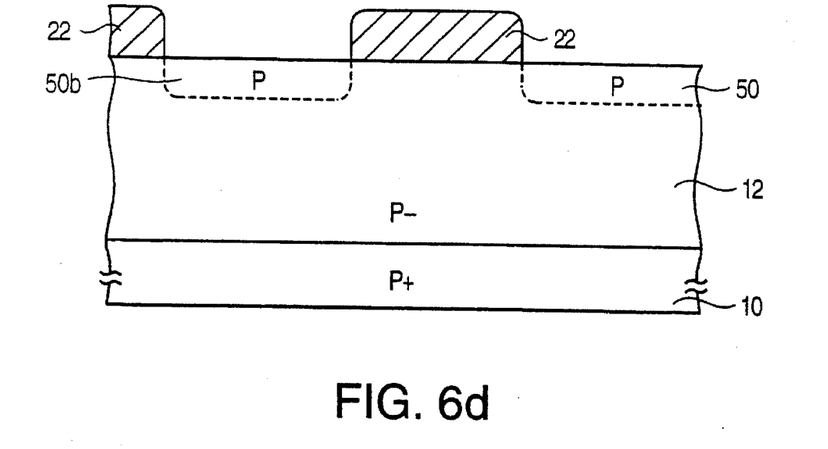

In FIG. 6d, the blanket boron implantation of region 50 is performed as described above at a dosage of 5E11 to 2E12/$cm^2$, thereby also forming a P doped region 50b. Regions 50 and 50b are relatively lightly doped regions. They are driven into a depth of approximately greater than 0.1 microns.

Figure 6E:
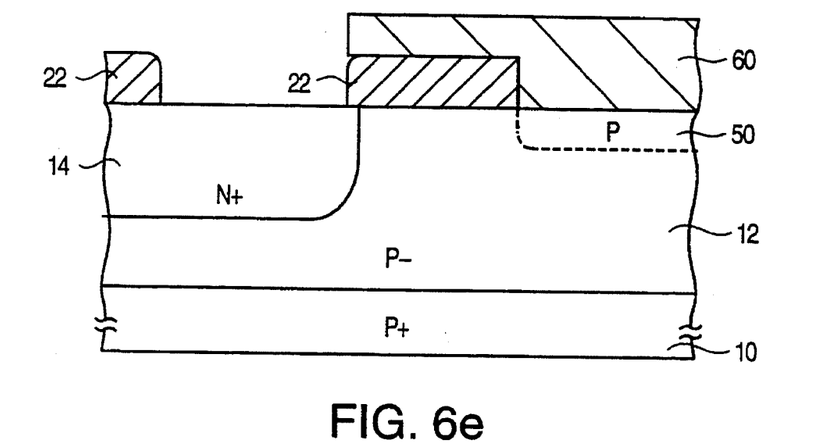

Then in FIG. 6e a conventional mask layer 60 is formed which defines the N+ doped body region 18 which is then conventionally implanted and driven in to form the N+ body region 14. This is a relatively highly doped N+ concentration and hence overcomes the P doping of region 50b which at this point effectively disappears. Mask layer 60 is then conventionally stripped off.

Figure 6F:
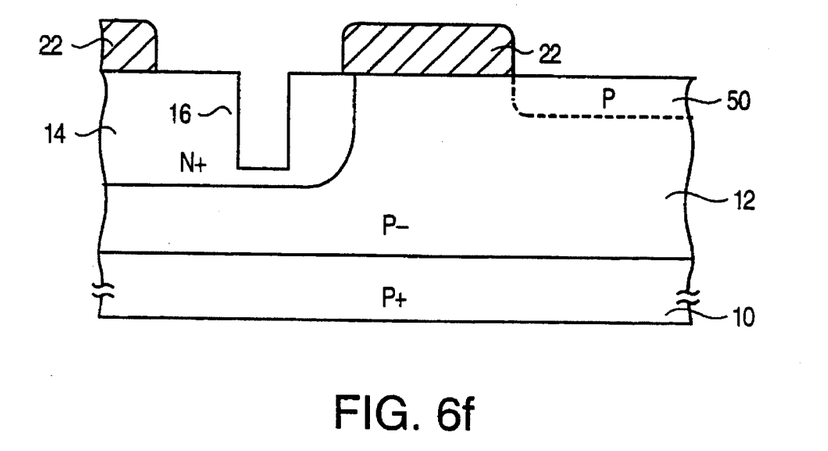

Then in FIG. 6f, trench 16 is conventionally formed by a masking step (not shown) and etching to form a conventional trench 16. The remaining process steps which include forming the other structure shown in FIG. 3 including the gate oxide layer 18, the doped polysilicon structures 20 and 26, the metal layer 28 and the overlying BPSG layer 30 are conventional and not shown herein.

An alternative set of process steps (not illustrated) to form the structure shown in FIGS. 3 or 4 is as follows:

1. Beginning with the substrate 10 having the epitaxial layer 12 formed thereon, form a masking layer over the principal surface of the epitaxial layer 12 and pattern this mask layer to define the N+ region 14.

2. Implant the N+ ions for region 14.

3. Diffuse the N+ ions and at the same time grow a thick field oxide (this is not a LOCOS step).

4. Form a mask layer to define the active portions of the transistor and pattern this mask layer accordingly, and use the mask layer to etch away selected portions of the thick field oxide.

5. Perform the blanket P doped implant to form the P doped region 50.

6. Form a hard mask layer over the principal surface and pattern this mask layer to define the location of the trenches. Then conventionally etch the trenches.

7. Complete the fabrication by forming and patterning the gate oxide layer, polysilicon conductive layer, BPSG and metallization layers.

This disclosure is illustrative and not limiting; further modifications will be apparent both to the disclosed structure and to the method to one skilled in the art in the light of this disclosure and are intended to fall within the scope of the appended claims.

We claim:

1. A method of forming a trenched semiconductor transistor device including a channel stop, comprising the steps of:

providing a substrate having a principal surface and being doped with a dopant of a first conductivity type;

forming a field oxide layer on portions of the principal surface, the field oxide layer not being present on a portion of the principal surface towards an edge of the substrate which is a termination region of the transistor;

implanting a dopant of the first conductivity type into the entire principal surface, thereby forming a doped channel stop region in the termination region;

implanting a dopant of a second opposite conductivity type in a central portion of the substrate, thereby forming a body region of the transistor;

forming a trench in the central portion of the substrate; and forming a conductive gate electrode in the trench.

2. The method of claim 1, further comprising the step of forming a conductive layer overlying the principal surface at the doped channel stop region and extending to an edge of the substrate.

3. The method of claim 1, wherein the field oxide layer overlies a portion of the principal surface between the body region and the doped channel stop region and does not extend over the doped channel stop region.

4. The method of claim 1, wherein the step of forming the field oxide layer includes locally oxidizing portions of the principal surface of the substrate.

5. The method of claim 1, wherein the step of forming the field oxide layer includes:

growing a layer of field oxide over the principal surfaces of the substrate; and patterning the layer of field oxide.

6. The method of claim 1, further comprising the steps of:

forming a trench in the termination region; and filling the trench with a conductive structure.

7. A method of forming a trenched semiconductor device including a channel stop in a substrate of a first conductivity type, comprising the steps of:

forming at least one active transistor body region in a central part of the substrate and doped with a dopant of a second opposite conductivity type;

forming at least two trenches in the substrate, a first trench being formed in the central part of the substrate and a second trench towards an edge of the substrate;

insulating interior walls of the trenches; and forming conductive structures in the first and second trenches and extending over a principal surface of the substrate, wherein a portion of the substrate doped the first conductivity type is immediately laterally adjacent the second trench, whereby the second trench is a channel stop termination structure.

8. The method of claim 7, further comprising the step of forming a field oxide layer on the principal surface between the first and second trenches.

9. The method of claim 7, wherein the step of forming conductive structures includes the steps of:

filling the first and second trenches with polycrystalline silicon; and doping the polycrystalline silicon.

10. The method of claim 7, wherein the second trench extends to an edge of the substrate.

11. The method of claim 8, wherein the conductive structure in the second trench extends from a lateral edge of the field oxide layer to an edge of the substrate.

* * * * *